United States Patent
Wen et al.

(10) Patent No.: US 9,406,578 B2
(45) Date of Patent: Aug. 2, 2016

(54) CHIP PACKAGE HAVING EXTENDED DEPRESSION FOR ELECTRICAL CONNECTION AND METHOD OF MANUFACTURING THE SAME

(71) Applicant: XINTEC INC., Taoyuan (TW)

(72) Inventors: Ying-Nan Wen, Hsinchu (TW); Chien-Hung Liu, New Taipei (TW); Ho-Yin Yiu, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/638,219

(22) Filed: Mar. 4, 2015

(65) Prior Publication Data

US 2015/0255358 A1 Sep. 10, 2015

Related U.S. Application Data

(60) Provisional application No. 61/949,606, filed on Mar. 7, 2014.

(51) Int. Cl.
*H01L 23/48* (2006.01)
*H01L 21/44* (2006.01)
(Continued)

(52) U.S. Cl.
CPC .......... *H01L 23/3114* (2013.01); *H01L 21/268* (2013.01); *H01L 21/31053* (2013.01); *H01L 21/56* (2013.01); *H01L 21/76877* (2013.01); *H01L 21/76895* (2013.01); *H01L 21/76898* (2013.01); *H01L 23/3185* (2013.01); *H01L 23/481* (2013.01); *H01L 24/02* (2013.01);
(Continued)

(58) Field of Classification Search
CPC .............. H01L 23/481; H01L 23/3114; H01L 21/76877; H01L 21/268; H01L 21/31053; H01L 21/76895; H01L 21/76898; H01L 21/56; H01L 24/13
USPC .......................................... 257/698, 738, 780
See application file for complete search history.

(56) References Cited

U.S. PATENT DOCUMENTS

| 5,910,687 | A | * | 6/1999 | Chen ........................ H01L 21/78 257/506 |
| 6,110,825 | A | * | 8/2000 | Mastromatteo ... H01L 21/76898 257/E21.597 |
| 2012/0280389 | A1 | * | 11/2012 | Liu .................... H01L 21/76898 257/737 |

FOREIGN PATENT DOCUMENTS

| TW | 200824081 | 6/2008 |
| TW | 201025544 | 7/2010 |

(Continued)

*Primary Examiner* — Hung Vu
(74) *Attorney, Agent, or Firm* — Liu & Liu

(57) ABSTRACT

A semiconductor package includes a semiconductor chip, a first and a second depression, a first and second redistribution layer and a packaging layer. The semiconductor chip has an electronic component and a conductive pad that are electrically connected and disposed on an upper surface of the semiconductor chip. The first depression and first redistribution layer extend from the upper surface toward the lower surface of the semiconductor chip. The first redistribution layer and the conductive pad are electrically connected. The second depression and the second redistribution layer extends from the lower surface toward the upper surface and is in connection with the first depression through a connection portion. The second redistribution layer is electrically connected to the first redistribution layer through the connection portion. The packaging layer is disposed on the lower surface.

22 Claims, 7 Drawing Sheets

(51) Int. Cl.
*H01L 23/31* (2006.01)
*H01L 21/268* (2006.01)
*H01L 21/3105* (2006.01)
*H01L 21/56* (2006.01)
*H01L 21/768* (2006.01)
*H01L 23/00* (2006.01)

(52) U.S. Cl.
CPC ............... *H01L24/13* (2013.01); *H01L 21/561* (2013.01); *H01L 2224/0231* (2013.01); *H01L 2224/02331* (2013.01); *H01L 2224/02372* (2013.01); *H01L 2224/0401* (2013.01); *H01L 2224/13014* (2013.01); *H01L 2224/13016* (2013.01); *H01L 2224/13024* (2013.01); *H01L 2924/12042* (2013.01); *H01L 2924/20643* (2013.01); *H01L 2924/20644* (2013.01); *H01L 2924/20645* (2013.01); *H01L 2924/20646* (2013.01)

(56) References Cited

FOREIGN PATENT DOCUMENTS

| | | |
|---|---|---|
| TW | 201225259 | 6/2012 |
| TW | 201332068 | 8/2013 |
| TW | 201338116 | 9/2013 |
| TW | 201351608 | 12/2013 |

\* cited by examiner

US 9,406,578 B2

CHIP PACKAGE HAVING EXTENDED DEPRESSION FOR ELECTRICAL CONNECTION AND METHOD OF MANUFACTURING THE SAME

RELATED APPLICATIONS

This application claims priority of U.S. Provisional Application Ser. No. 61/949,606, filed Mar. 7, 2014.

BACKGROUND

1. Field of Invention

The present invention relates to a package and method of manufacturing the same. More particularly, the present invention relates to a chip package and method of manufacturing the same.

2. Description of Related Art

Demand of better device function is increasing, and the semiconductor chip package industry also thrives to meet the target. Device is much more compact and at the same time having multiple functions. The semiconductor chip packaging technique has to advance so as to achieve the requirement. Wafer-level chip packaging is a type of semiconductor chip packaging. It refers to a method which packages and tests all the chips on the wafer after the chips are completed. Then the chips are separated by cutting to a single chip.

As previously mentioned, the semiconductor chip design is more complex due to downsizing and multi-function. As a result, manufacturing process is more difficult for producing the semiconductor chips, and cost increases. In addition, production yield is prone to a lower rate. Also, a single chip package has to be combined with other chip package or circuit board or other electronic components, and therefore it requires a careful design for the sake of further processing.

Accordingly a chip package that is reliable, has lower production cost, and can be easily combined with other electronic components is the major concern in the field.

SUMMARY

The instant disclosure provides a chip package and method of manufacturing the same. The chip package has dual redistribution layers electrically connecting the conductive pad on the upper surface to the solder ball or solder wires on the lower surface. Therefore, the conductive path of the conductive pad on the semiconductor chip is achieved by the upper and lower dual redistribution layers. Accordingly, the thickness of the semiconductor chip remains the same, and it is not necessary to form a rather thin semiconductor chip or use a carrier substrate. The production cost can be greatly reduced. A thicker semiconductor chip has stronger mechanical strength and the yield rate increases together. The manufacturing process is easier to maintained. In addition, the upper surface of the semiconductor chip may be a planar surface that serves for stacking other chip packages and multiplying its functions.

The instant disclosure provides a semiconductor package including a semiconductor chip, a first depression, a first redistribution layer, a second depression, a second redistribution layer and a packaging layer. The semiconductor chip has an electronic component and a conductive pad, and the conductive pad and the electronic component are electrically connected and disposed on an upper surface of the semiconductor chip. The first depression recesses from the upper surface toward a lower surface of the semiconductor chip. The first redistribution layer extends from the upper surface toward the lower surface, and the first redistribution layer and the conductive pad are electrically connected and a portion of the first redistribution layer is disposed in the first depression. The second depression recesses from the lower surface toward the upper surface and is in connection with the first depression through a connection portion. The second redistribution layer extends from the lower surface toward the upper surface, a portion of the second redistribution layer is disposed in the second depression, and the second redistribution layer is electrically connected to the first redistribution layer through the connection portion. The packaging layer is disposed on the lower surface.

In an embodiment of the instant disclosure, the chip package further includes a first insulation layer disposed in the first depression, and a portion of the first redistribution layer is disposed on the first insulation layer.

In an embodiment of the instant disclosure, the first insulation layer is formed with an opening, and the second redistribution layer is electrically connected to the first redistribution layer through the opening.

In an embodiment of the instant disclosure, the chip package further includes a first passivation layer filling in the first depression and covering the upper surface and the first redistribution layer.

In an embodiment of the instant disclosure, a surface of the first passivation layer is substantially planar.

In an embodiment of the instant disclosure, the chip package further includes a second passivation layer disposed in the second depression and covering the lower surface. The second passivation layer is sandwiched between the semiconductor chip and the second redistribution layer.

In an embodiment of the instant disclosure, the packaging layer fills the second depression.

In an embodiment of the instant disclosure, the chip package further includes a second passivation layer filling the second depression and covering the lower surface and the second redistribution layer.

In an embodiment of the instant disclosure, the chip package further includes a second insulation layer disposed in the second depression, the second insulation layer having an opening, the second redistribution layer electrically connected to the first redistribution layer through the opening.

In an embodiment of the instant disclosure, the packaging layer extends from the lower surface toward the upper surface, and a portion of the packaging layer is disposed in the second depression.

In an embodiment of the instant disclosure, the chip package further includes a soldering ball disposed under the packaging layer. The soldering ball is electrically connected to the second redistribution layer through an opening of the packaging layer.

In an embodiment of the instant disclosure, a distance between the upper and lower surface is substantially 300 to 600 µm.

The instant disclosure provides a method of manufacturing chip package including providing a semiconductor chip having an electronic component and a conductive pad. The conductive pad and the electronic component are electrically connected and disposed on an upper surface of the semiconductor chip. Next, a first depression is formed by recessing from the upper surface toward a lower surface of the semiconductor chip. A first redistribution layer is formed by extending from the upper surface toward the lower surface. The first redistribution layer and the conductive pad are electrically connected and a portion of the first redistribution layer is disposed in the first depression. A second depression is formed by recessing from the lower surface toward the upper surface and in connection with the first depression. Then, a second redistribution layer is formed by recessing from the lower surface toward the upper surface. A portion of the second redistribution layer is disposed in the second depression and the second redistribution layer is electrically connected to the first redistribution layer. Finally, a packaging layer is disposed on the lower surface.

In an embodiment of the instant disclosure, in the step of forming the first redistribution layer further includes forming a first insulation layer disposed in the first depression.

In an embodiment of the instant disclosure, in the step of forming the second depression further includes forming a first passivation layer filling in the first depression and covering the upper surface and the first redistribution layer, and planarizing the first passivation layer to substantially planar.

In an embodiment of the instant disclosure, the steps of forming the second depression and the second redistribution layer further include forming a second passivation disposed in the second depression and covering the lower surface.

In an embodiment of the instant disclosure, the steps of forming the second depression and the second redistribution layer further include forming a second insulation layer disposed in the second depression.

In an embodiment of the instant disclosure, in the step of forming the second depression further includes forming a second passivation layer covering the lower surface.

In an embodiment of the instant disclosure, the second depression is formed by through-silicon via.

In an embodiment of the instant disclosure, the second depression is formed by laser drilling.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
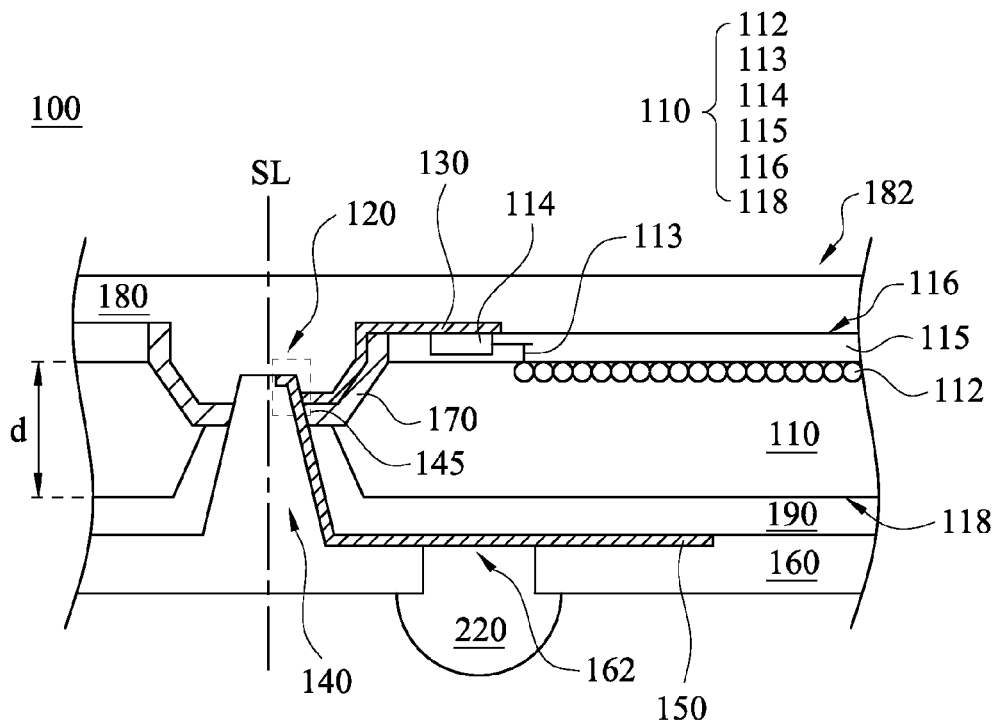
FIG. 1 is a partially cross-sectional view of a chip package in accordance with an embodiment of the instant disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a partially cross-sectional view of a chip package in accordance with an embodiment of the instant disclosure. Please refer to FIG. 1. The chip package 100 includes a semiconductor chip 110, a first depression 120, a first redistribution layer 130, a second depression 140, a second redistribution layer 150 and a packaging layer 160. The semiconductor chip 110 has at least an electronic component 112 and at least a conductive pad 114. The conductive pad 114 and the electronic component 112 are electrically connected and disposed on an upper surface 116 of the semiconductor chip 110. The semiconductor chip 110 may be silicon, germanium or group III-V element substrate, acting as a platform for the electronic component 112 and the conductive pad 114. In some embodiments of the instant disclosure, the electronic component 112 may be light sensitive component. However, the instant disclosure is not limited thereto. The electronic component 112 may be, for example, active element, passive elements, digital circuit, analogue circuit or other electronic components of an integrated circuit, micro electro mechanical systems (MEMS), micro fluidic systems, physical sensor using heat, light or pressure, RF circuits, accelerators, gyroscopes, micro actuator, surface sound wave element, or pressure sensors. However, the instant disclosure is not limited thereto. As shown in FIG. 1, the conductive pad 114 is disposed on the upper surface 116 of the semiconductor chip 110, and the electronic component 112 is disposed in the semiconductor chip 110. The semiconductor chip 110 may further include, for example, an interconnection structure 113 and an interlevel dielectric layer 115. The interconnection structure 113 and the interlevel dielectric layer 115 are disposed on the upper surface 116 of the semiconductor chip 110. The conductive pad 114 may be, for example, electrically connected to the electronic component 112 through the interconnection structure 113 within the interlevel dielectric layer 115. The conductive pad 114 serves as signal control input/output end for the electronic component 112 of the chip package 100. Materials of the conductive pad 114 may be, for example, aluminium, copper, nickel or other suitable conductive materials.

Still referring to FIG. 1, the first depression 120 recesses from the upper surface 116 toward the lower surface 118. The first depression 120 may be formed by, for example, photolithography etching. More specifically, the first depression 120 is formed by etching from the upper surface 116 of the semiconductor chip 110 corresponding to the edge of the semiconductor chip 110 (i.e., the predetermined scribe line SL) and advancing toward the lower surface 118 of the semiconductor chip 110. The first redistribution layer 130 extends from the upper surface 116 toward the lower surface 118. The first redistribution layer 130 and the conductive pad 114 are electrically connected, and a portion of the first redistribution layer 130 is disposed in the first depression 120. Materials of the first redistribution layer 130 may be aluminium, copper or other suitable conductive materials. The first redistribution layer 130 is formed by, for example, conductive material deposition to form conductive film and undergoing photolithography etching to form the first redistribution layer 130 having predetermined redistribution pattern. As shown in FIG. 1, in some embodiments of the instant disclosure, the chip package 100 further includes a first insulation layer 170 disposed in the first depression 120. A portion of the first redistribution layer 130 is disposed on the first insulation layer 170. Materials of the first insulation layer 170 include silicon oxide, silicon nitride, silicon oxynitride or other suitable insulation materials. The insulation materials are deposited by chemical vapour deposition (CVD) and conform to the upper surface 116 of the semiconductor 110 and the first depression 120 to form an insulation film. Then photolithography etching is used to reserve a portion of the insulation film in the first depression 120 to complete the first insulation layer 170. The first insulation layer 170 can effectively reduce the surface roughness of the first depression 120 caused in the etching process. The chance of wire breaking is greatly reduced in the following step where the first redistribution layer 130 formation takes place in the first depression 120.

Still referring to FIG. 1, the second depression 140 recesses from the lower surface 118 toward the upper surface 116 and is in connection with the first depression 120 through a connection portion 145. The second depression 140 may be formed by, for example, photolithography etching. More specifically, the second depression 140 is formed by etching from the lower surface 118 of the semiconductor chip 110 corresponding to the edge of the semiconductor chip 110 (i.e., the predetermined scribe line SL) and advancing toward the upper surface 116 of the semiconductor chip 110. It should be noted that the combined depth of the first and second depressions 120, 140 is larger than a distance d measuring from the upper surface 116 to the lower surface 118. More specifically, combining the depth of the second depression 140 measuring from the lower surface 118 toward the upper surface 116 and the depth of the first depression 120 measuring from the upper surface 116 toward the lower surface 118 is greater than the distance d. In other words, a connection portion 145 is present between the second depression 140 and the first depression 120. The second depression 140 recesses from the lower surface 118 toward the upper surface 116 and is in connection with the first depression 120 through the connection portion 145. The second redistribution layer 150 extends from the lower surface 118 toward the upper surface 116, and a portion of the second redistribution layer 150 is disposed in the second depression 140. Furthermore, the second redistribution layer 150 is electrically connected to the first redistribution layer through the connection portion 145. As shown in FIG. 1, in some embodiments of the instant disclosure, the second redistribution layer 150 and the first redistribution layer 130 form a T contact at the connection portion 145. Materials of the second redistribution layer 150 may be, for example, aluminium, copper or other suitable conductive materials. The second redistribution layer 150 is formed by, for example, the previously described conductive material deposition to form a conductive film. Next, the conductive film is photolithography etched to a predetermined redistribution pattern of the second redistribution layer 150. As shown in FIG. 1, in some embodiments of the instant disclosure, the packaging layer 160 fills in the second depression 140. The packaging layer 160 is disposed on the lower surface 118. Materials of the packaging layer 160 may be solder mask or other suitable packaging materials. The packaging material is sputtered conformingly to the lower surface 118 of the semiconductor chip 110 and the second redistribution layer 150.

It should be noted that the chip package 100 of the instant disclosure relies on the electrical connection between the first redistribution layer 130 that extends from the upper surface 116 toward the lower surface 118 and the second redistribution layer 150 that extends from the lower surface 118 toward the upper surface 116 such that the conductive pad 114 on the upper surface 116 of the semiconductor chip 110 has an electrical path extending to the lower surface 118 of the semiconductor chip 110. In other words, the upper surface 116 and the lower surface 118 of the semiconductor 110, each of which has the first redistribution layer 130 and the second redistribution layer 150 respectively. As a result, the semiconductor chip can be manufactured with a thicker profile, and the semiconductor chip does not need to be thinned or use a carrier substrate. Accordingly, the production cost of semiconductor chip can further reduce. As shown in FIG. 1, in some embodiments of the instant disclosure, the distance d between the upper surface to the lower surface of the semiconductor chip 110 is approximately 300 to 600 μm. The semiconductor chip having thicker profile has better mechanical strength, the process margin is effectively improved and the process yield elevates.

As shown in FIG. 1, in some embodiments of the instant disclosure, chip package 100 further includes a solder ball 220 disposed on the lower surface 118. The solder ball 220 is electrically connected to the second redistribution layer 150 through the opening 162 of the packaging layer 160. Materials of the solder ball 220 may be, for example, tin or other suitable metal or metal alloys for soldering. The solder ball 220 can serve as a connection bridge between the chip package 100 when externally connecting to a printed circuit board or other interposer. The input/output current signal from other interposer can be transmitted through the solder ball 220, second redistribution layer 150, first redistribution layer 130 and the conductive pad 114 that is electrically connected to the electronic component 112 and therefore control the signal input/output of the electronic component 112 of the chip package 100. However, the instant disclosure is not limited thereto. In some embodiments of the instant disclosure, the chip package 100 may further include a solder pad and solder wire soldered to the solder pad. The solder pad and the second redistribution 150 are electrically connected. The solder wire acts as a connection bridge between the chip package 100 when externally connecting with printed circuit board or other interposer. The input/output current signal from other interposer can be transmitted through the solder pad, second redistribution layer 150, first redistribution layer 130 and the conductive pad 114 that is electrically connected to the electronic component 112 and therefore control the signal input/output of the electronic component 112 of the chip package 100.

As shown in FIG. 1, in some embodiments of the instant disclosure, the chip package 100 further includes a first passivation layer 180 filling the first depression 120 and covering the upper surface 116 and the first redistribution layer 130. The first passivation layer 180 may be, for example, but not limited to, silicon nitride or silicon ox/nitride). The first passivation layer 180 can provide air isolation or external force buffering so as to protect the electronic components 112, conductive pad 114 and the interconnection structure 113 in the semiconductor chip 110 or other elements. The first passivation layer 180 is formed by, for example, chemical vapour deposition conforming to the upper surface 116 of the semiconductor chip 110 and the first depression 120 to form an insulation film. Chemical-mechanical polishing is then employed to planarize the insulation film to form the first passivation layer 180 shown in FIG. 1. In some embodiments of the instant disclosure, the surface 182 of the first passivation layer 180 is substantially planar. Therefore, one side of the semiconductor chip package 100 can be planar such that the application of the semiconductor chip package 100 is increased or an easier access for stacking can be provided. Especially when the electronic component 112 is a light sensitive component, a planar surface can be a light signal receiving surface. In addition, the first passivation layer 180 can be a film tailored for different wavelength of filter light incorporated with the light sensitive component. The first passivation layer 180 may be made of film having higher hardness coefficient so as to provide resistance to abrasion and protect the electronic component 112, conductive pad 114 and interconnection structure 113 of the semiconductor chip 110. As shown in FIG. 1, in some embodiments of the instant disclosure, chip package 100 further includes a second passivation layer 190 disposed in the second depression 140 and covering the lower surface 118. The second passivation layer 190 is sandwiched between the semiconductor chip 110 and the second redistribution layer 110. The second passivation layer 190 may be, but not limited to, for example, silicon nitride or silicon ox/nitride. The second passivation layer 190 can isolate air or buffer external force and therefore protect the electronic components 112, conductive pad 114 and the interconnection structure 113 in the semiconductor chip 110.

Figure 2:
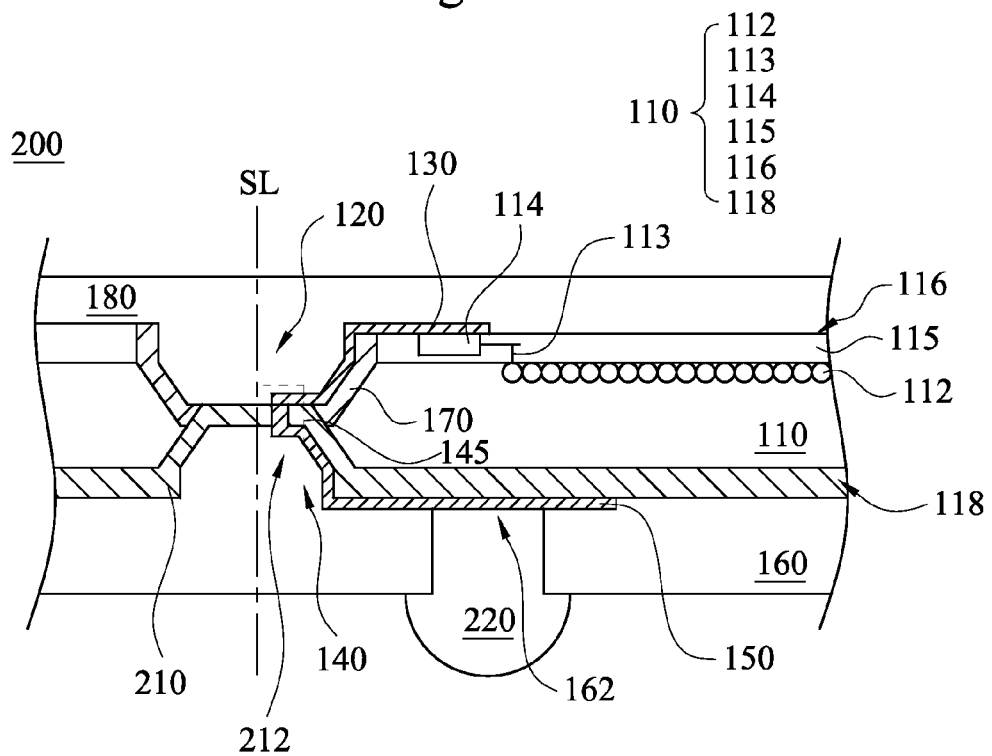
FIG. 2 is a partially cross-sectional view of a chip package in accordance with an embodiment of the instant disclosure.

FIG. 2 is a partially cross-sectional view of a chip package in accordance with an embodiment of the instant disclosure. Please refer to FIG. 2. The chip package 200 includes a semiconductor chip 110, a first depression 120, a first redistribution layer 130, a second depression 140, a second redistribution layer 150 and a packaging layer 160. The other detail is identical to the previously described chip package 100 and hereinafter not repeated to avoid redundancy. As shown in FIG. 2, the difference between the chip package 100 and 200 is elaborated as follow. The chip package 200 further includes a second insulation layer 210 disposed in the second depression 140. The second insulation layer 210 is formed with an opening 212. The second redistribution layer 150 is electrically connected to the first redistribution layer 130 through the opening 212. The opening 212 is positioned at the connection portion 145 between the second depression 140 and the first depression 120. Materials of the second insulation layer 210 may be silicon oxide, silicon nitride, silicon oxynitride or other suitable insulation material. The material conforms to the lower surface 118 of the semiconductor chip 110 and the second depression 140 by CVD. Then, photolithography etching is employed to form the opening 212 on the second insulation layer 210 shown in FIG. 2. The second insulation layer 210 can effectively reduce the surface roughness of the first depression 120 caused in the etching process. The chance of wire breaking is greatly reduced in the following step where the second redistribution layer 150 formation takes place in the second depression 140. As shown in FIG. 2, in some embodiments of the instant disclosure, the packaging layer 160 fills in the second depression 140 and covers the lower surface 118 and the second redistribution layer 150. Accordingly, the packaging layer 160 isolates air and buffers external force so as to protect the electronic components 112, conductive pad 114 and the interconnection structure 113 in the semiconductor chip 110, and the second redistribution layer 150. It should be noted that the chip package 200 of the instant disclosure relies on the electrical connection between the first redistribution layer 130 that extends from the upper surface 116 toward the lower surface 118 and the second redistribution layer 150 that extends from the lower surface 118 toward the upper surface 116 such that the conductive pad 114 on the upper surface 116 of the semiconductor chip 110 has an electrical path extending to the lower surface 118 of the semiconductor chip 110. As a result, the semiconductor chip can be manufactured with a thicker profile, and the semiconductor chip does not need to be thinned or with the help of a carrier substrate. Accordingly, the production cost of the semiconductor chip can further reduce. The semiconductor chip having thicker profile has better mechanical strength, the process yield elevates, and manufacturing process is less complex.

Figure 3:
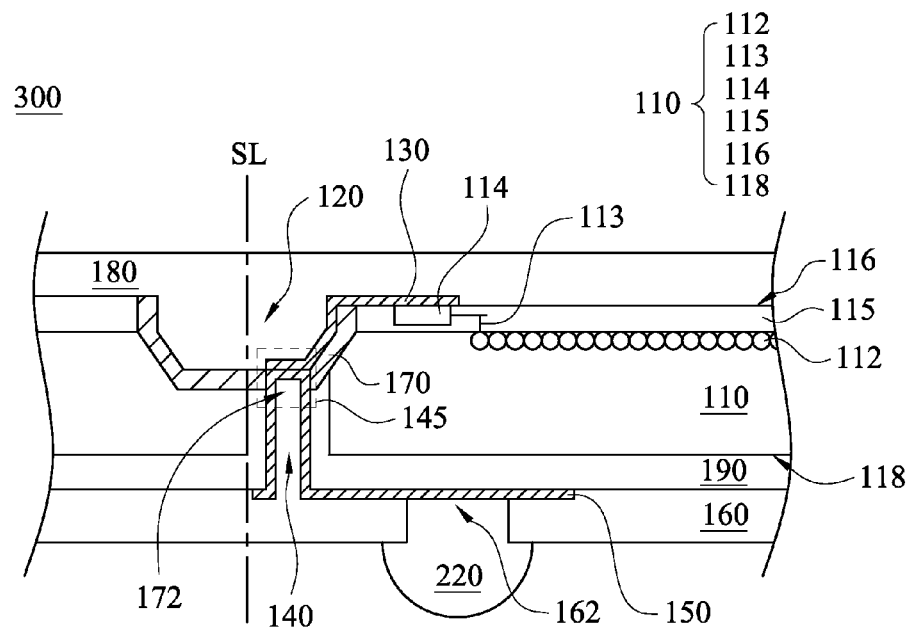
FIG. 3 is a partially cross-sectional view of a chip package in accordance with an embodiment of the instant disclosure.
Figure 4:
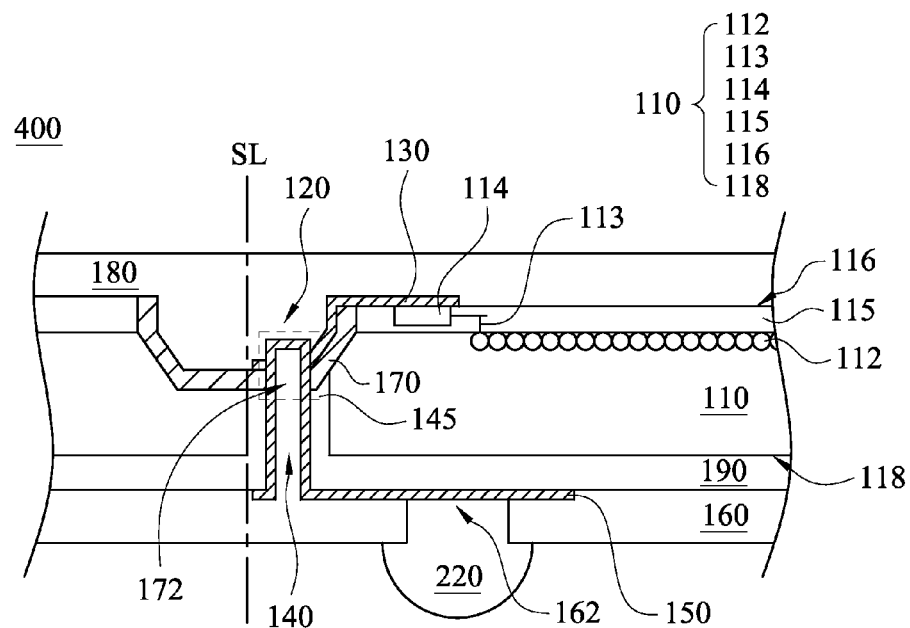
FIG. 4 is a partially cross-sectional view of a chip package in accordance with an embodiment of the instant disclosure.
Figure 5:
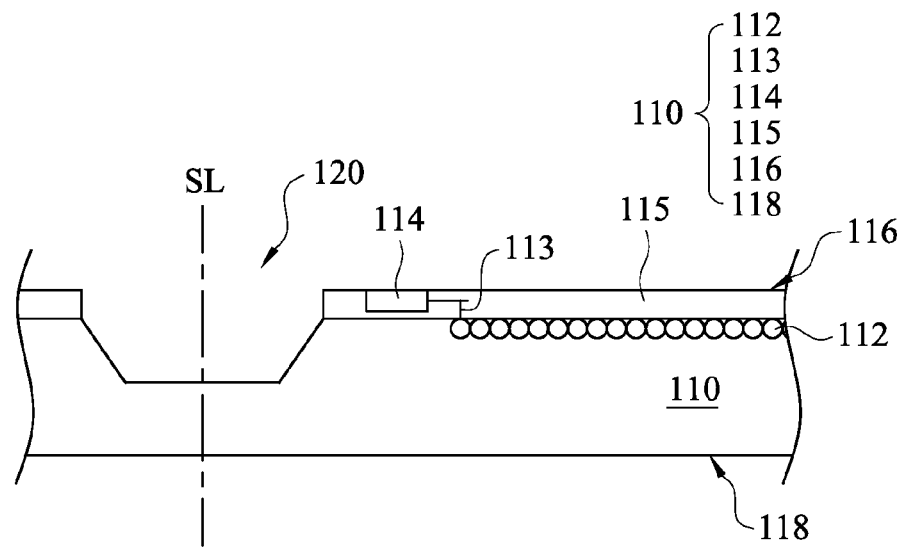
FIG. 5 to FIG. 9 are partially cross-sectional views showing a method of manufacturing chip package in accordance with an embodiment of the instant disclosure.

FIG. 3 is a partially cross-sectional view of a chip package 300 in accordance with an embodiment of the instant disclosure. Please refer to FIG. 3. The chip package 300 includes a semiconductor chip 110, a first depression 120, a first redistribution layer 130, a second depression 140, a second redistribution layer 150 and the packaging layer 160. The semiconductor 110, first depression 120, first redistribution layer 130, second depression 140, second redistribution layer 150 and the packaging layer 160 and the associated detail is identical to the chip package 100, and hereinafter it is not repeated to avoid redundancy. As shown in FIG. 3, the difference between the chip package 300 and chip package 100 is elaborated as follow. The first insulation layer 170 of the chip package 300 is formed with an opening 172. The second redistribution layer 150 is electrically connected to the first redistribution layer 130 through the opening 172. The opening 172 is positioned at the connection portion 145 between the second depression 140 and the first depression 120. More specifically, the second depression 140, connection portion 145 and opening 172 of the chip package 300 may be formed in one step or by multiple dry etching. As shown in FIG. 3, in some embodiments of the instant disclosure, the packaging layer 160 fills in the second depression 140. FIG. 4 is a partially cross-sectional view of a chip package 400 in accordance with an embodiment of the instant disclosure. Please refer to FIG. 4. The chip package 400 includes a semiconductor chip 110, a first depression 120, a first redistribution layer 130, a second depression 140, a second redistribution layer 150 and the packaging layer 160. The semiconductor 110, first depression 120, first redistribution layer 130, second depression 140, second redistribution layer 150 and the packaging layer 160 and the associated detail is identical to the chip package 100, and hereinafter it is not repeated to avoid redundancy. As shown in FIG. 4, the difference between the chip package 400 and chip package 300 is elaborated as follow. The second depression 140, connection portion 145 and the opening 172 of the chip package 400 may be formed in on step of in multiple steps such as laser drilling. As shown in FIG. 4, in some embodiments of the instant disclosure, the packaging layer 160 fills in the second depression 140. It should be noted that the chip package 300 and the chip package 400 of the instant disclosure rely on the electrical connection between the first redistribution layer 130 that extends from the upper surface 116 toward the lower surface 118 and the second redistribution layer 150 that extends from the lower surface 118 toward the upper surface 116 such that the conductive pad 114 on the upper surface 116 of the semiconductor chip 110 has an electrical path extending to the lower surface 118 of the semiconductor chip 110. As a result, the semiconductor chip can be manufactured with a thicker profile, and the semiconductor chip does not need to be thinned or with the help of a carrier substrate. Accordingly, the production cost of the semiconductor chip can further reduce. The semiconductor chip having thicker profile has better mechanical strength, the process yield elevates, and manufacturing process is less complex.

FIG. 5 to FIG. 9 are partially cross-sectional views showing a method of manufacturing chip package in accordance with an embodiment of the instant disclosure. Please refer to FIG. 5. A semiconductor chip 110 is provided. The semiconductor chip 110 includes an electronic component 112 and conductive pad 114. The conductive pad 114 and the electronic component 112 are electrically connected and disposed on an upper surface 116 of the semiconductor 110. The semiconductor chip 110 may further include, for example, an interconnection structure 113 and an interlevel dielectric layer 115. The interconnection structure 113 and the interlevel dielectric layer 115 are disposed on the upper surface 116 of the semiconductor chip 110. The conductive pad 114 may be, for example, electrically connected to the electronic component 112 through the interconnection structure 113 within the interlevel dielectric layer 115. The conductive pad 114 serves as signal control input/output end for the electronic component 112 of the chip package 100. The electronic component 112, conductive pad 114, interconnection structure 113 and the interlevel dielectric layer 115 are described in the previous embodiments and hereinafter not repeated to avoid redundancy. Next, a first depression 120 recesses from the upper surface 116 toward the lower surface 118 of the semiconductor chip 110. The first depression 120 may be formed by, for example, etching from the upper surface 116 of the semiconductor chip 110 corresponding to the edge of the semiconductor chip 110 (i.e., the predetermined scribe line SL) and advancing toward the lower surface 118 of the semiconductor chip 110.

Figure 6:
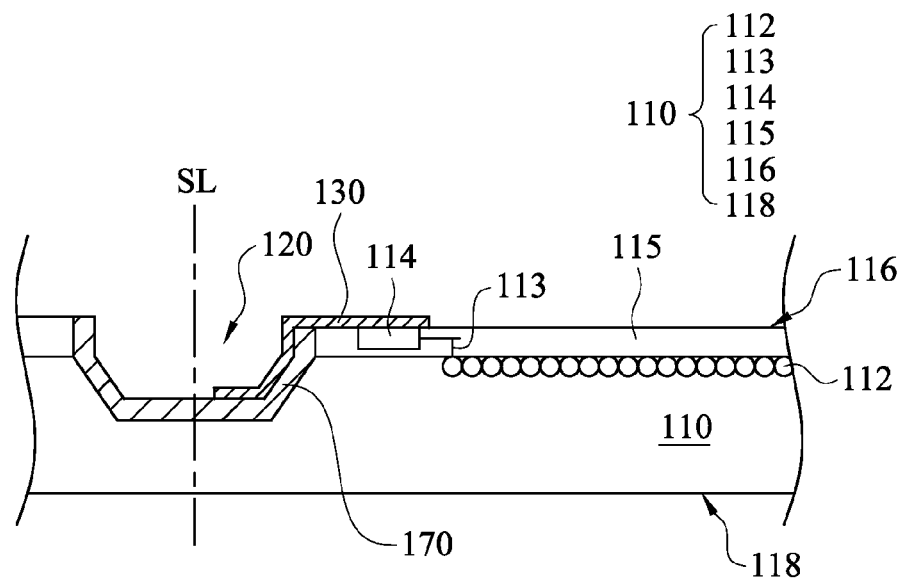

Please refer to FIG. 6. A first redistribution layer 130 is formed by extending from the upper surface 116 toward the lower surface 118. The first redistribution layer 130 and the conductive pad 114 are electrically connected, and a portion of the first redistribution layer 130 is disposed in the first depression 120. Materials of the first redistribution layer 130 may be aluminium, copper or other suitable conductive materials. The first redistribution layer 130 is formed by, for example, conductive material deposition to form conductive film and undergoing photolithography etching to form the first redistribution layer 130 having predetermined redistribution pattern. As shown in FIG. 6, in some embodiments of the instant disclosure, before the formation of the first redistribution layer 130, a first insulation layer 170 is formed in the first depression 120. Materials of the first insulation layer 170 include silicon oxide, silicon nitride, silicon oxynitride or other suitable insulation materials. The insulation materials are deposited by chemical vapour deposition (CVD) and conform to the upper surface 116 of the semiconductor 110 and the first depression 120 to form an insulation film. Then photolithography etching is employed to reserve a portion of the insulation film in the first depression 120 to complete the first insulation layer 170. The first insulation layer 170 can effectively reduce the surface roughness of the first depression 120 caused in the etching process. The chance of wire breaking is greatly reduced in the following step where first redistribution layer 130 formation takes place in the first depression 120.

Figure 7:
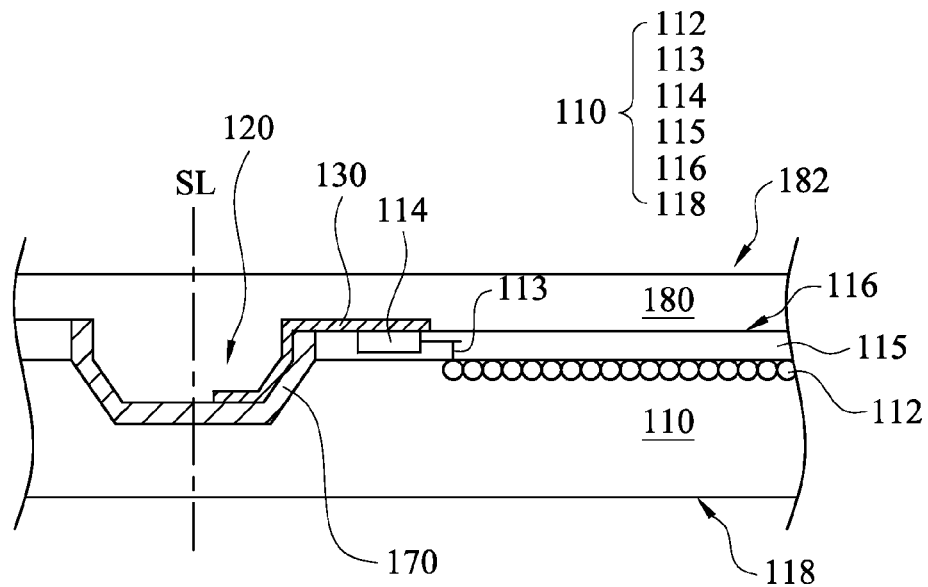
Figure 8:
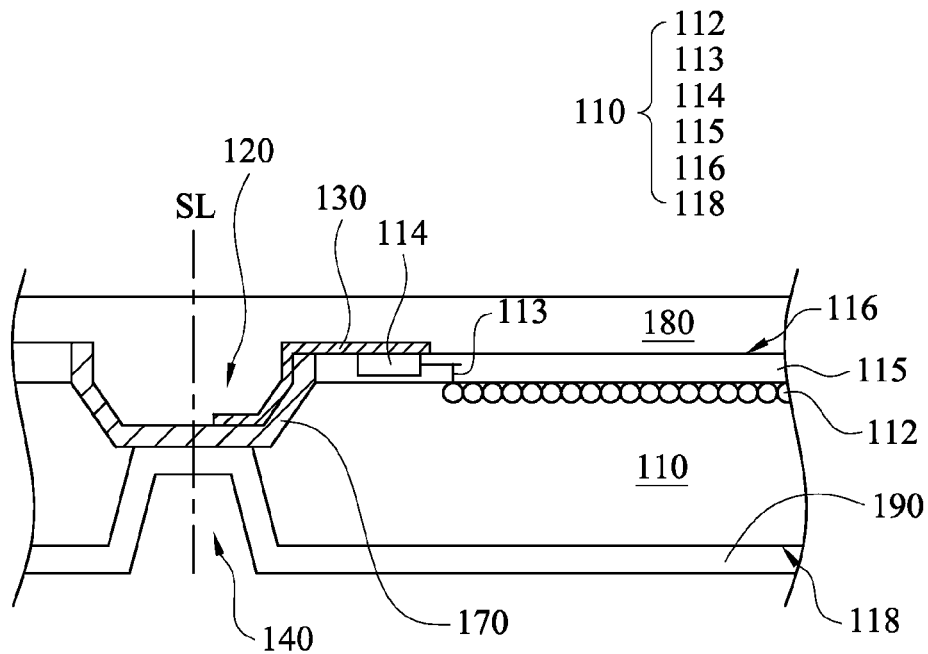
Figure 9:
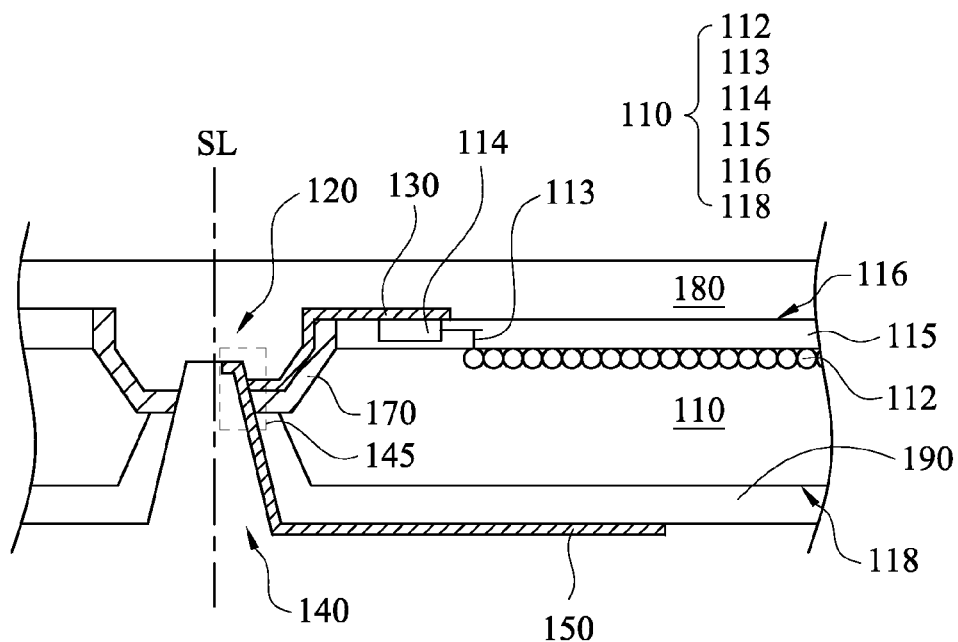

Please refer to FIG. 7. In some embodiments of the instant disclosure, before the formation of the second depression 140, a first passivation layer 1800 is formed and fills in the first depression 120 and covers the upper surface 116 and the first redistribution layer 130. Subsequently, the first passivation layer 180 is planarized such that a surface 182 of the passivation layer 180 is substantially planar. Therefore, one side of the semiconductor chip package 100 can be planar such that the application of the semiconductor chip package 100 is improved or an easier access for stacking can be provided. Especially when the electronic component 112 is a light sensitive component, a planar surface can be a light signal receiving surface. Still referring to FIG. 8, a second depression 140 recesses from the lower surface 118 toward the upper surface 116 and connects the first depression 120. As shown in FIG. 8, in some embodiments of the instant disclosure, in between the steps of forming the second depression and the second redistribution layer, a second passivation layer 190 is formed and disposed in the second depression 140 and covering the lower surface 118. Please refer to FIG. 9. A second redistribution layer 150 extends from the lower surface 118 toward the upper surface 116, and a portion of the second redistribution layer 150 is disposed in the second depression and the second redistribution layer 150 is electrically connected to the first redistribution layer 130. The second redistribution layer 150 is formed by, for example, conductive material deposition to form a conductive film. Next, the conductive film is photolithography etched to a predetermined redistribution pattern of the second redistribution layer 150. Finally, please refer to FIG. 1. The packaging layer 160 is formed on the lower surface 118. Materials of the packaging layer 160 may be solder mask or other suitable packaging materials. The packaging material is sputtered conformingly to the lower surface 118 of the semiconductor chip 110 and the second redistribution layer 150. In some embodiments of the instant disclosure, a solder ball 220 is formed on the lower surface 118. The solder ball 220 is electrically connected to the second redistribution layer 150 through the opening 162 of the packaging layer 160. Materials of the solder ball 220 may be, for example, tin or other suitable metal or metal alloys for soldering. The solder ball 220 can serve as a connection bridge between the chip package 100 when externally connecting to a printed circuit board or other interposer. The input/output current signal from other interposer can be transmitted through the solder ball 220, second redistribution layer 150, first redistribution layer 130 and the conductive pad 114 that is electrically connected to the electronic component 112 and therefore control the signal input/output of the electronic component 112 of the chip package 100.

Figure 10:
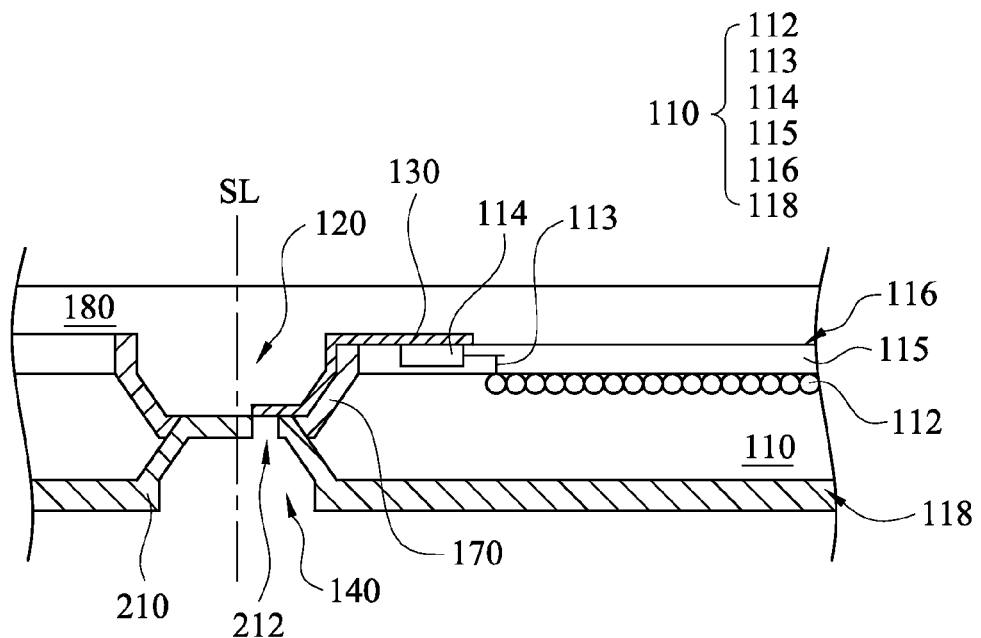
FIG. 10 to FIG. 11 are partially cross-sectional views showing different phases in a method of manufacturing chip package in accordance with an embodiment of the instant disclosure.
Figure 11:
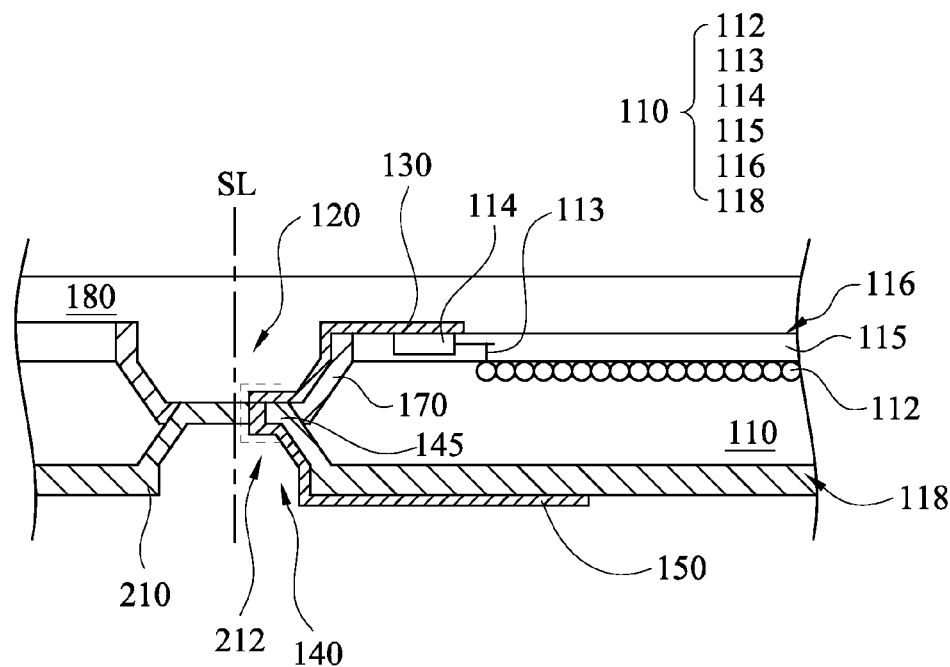

FIG. 10 to FIG. 11 are partially cross-sectional views showing different phases in a method of manufacturing chip package in accordance with an embodiment of the instant disclosure. The second insulation layer 210 is formed with an opening 212. The second redistribution layer 150 is electrically connected to the first redistribution layer 130 through the opening 212. The second opening 212 is positioned at the connection portion 145 between the second depression 140 and the first depression 120. The second insulation layer 210 may be formed by CVD, conformingly depositing on the lower surface 118 of the semiconductor chip 110 and the second depression 140. Materials of the second insulation layer 210 may be silicon oxide, silicon nitride, silicon oxynitride or other suitable insulation material. Then, photolithography etching is employed to form the opening 212 on the second insulation layer 210 shown in FIG. 10. The second insulation layer 210 can effectively reduce the surface roughness of the first depression 120 caused in the etching process. The chance of wire breaking is greatly reduced in the following step where the second redistribution layer 150 formation takes place in the second depression 140. Referring now to FIG. 11, a second redistribution layer 150 extends from the lower surface 118 toward the upper surface 116. A portion of the second redistribution layer 150 is disposed in the second depression 140 and the second redistribution layer 150 and the first redistribution layer 130 are electrically connected. Please refer back to FIG. 2. The packaging layer 160 is disposed on the lower surface 118. Materials of the packaging layer 160 may be solder mask or other suitable packaging materials. The packaging material is sputtered conformingly to the lower surface 118 of the semiconductor chip 110 and the second redistribution layer 150.

Figure 12:
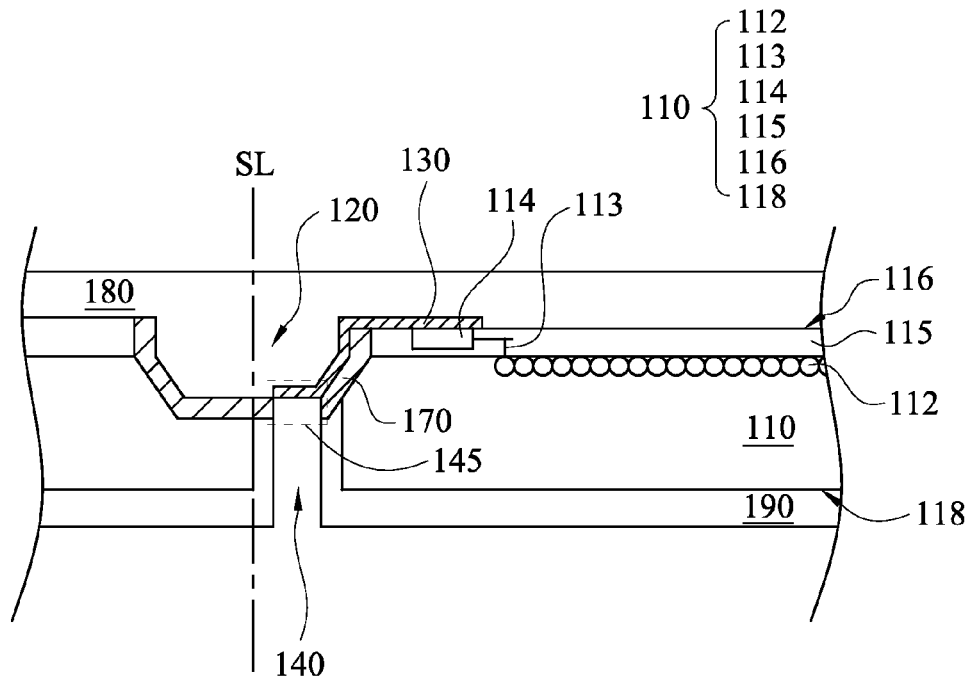
FIG. 12 is a partially cross-sectional view showing a step of manufacturing chip package in accordance with an embodiment of the instant disclosure.

FIG. 12 is a partially cross-sectional view showing a step of manufacturing chip package in accordance with an embodiment of the instant disclosure. Please refer to FIG. 12. Before the formation of the second depression 140, a second passivation layer 190 is formed and covering the lower surface 118. Subsequently, the second depression 140 is formed by through-silicon via. As shown in FIG. 12, the through-silicon via etching has an end where the first redistribution layer 130 is exposed. As a result, a connection portion 145 is formed between the second depression 140 and the first depression 120. Referring back to FIG. 3, the second redistribution layer 150 is electrically connected to the first redistribution layer 130 through the connection portion 145. The packaging layer and the solder ball 220 are formed by identical method and hereinafter not repeated.

Figure 13:
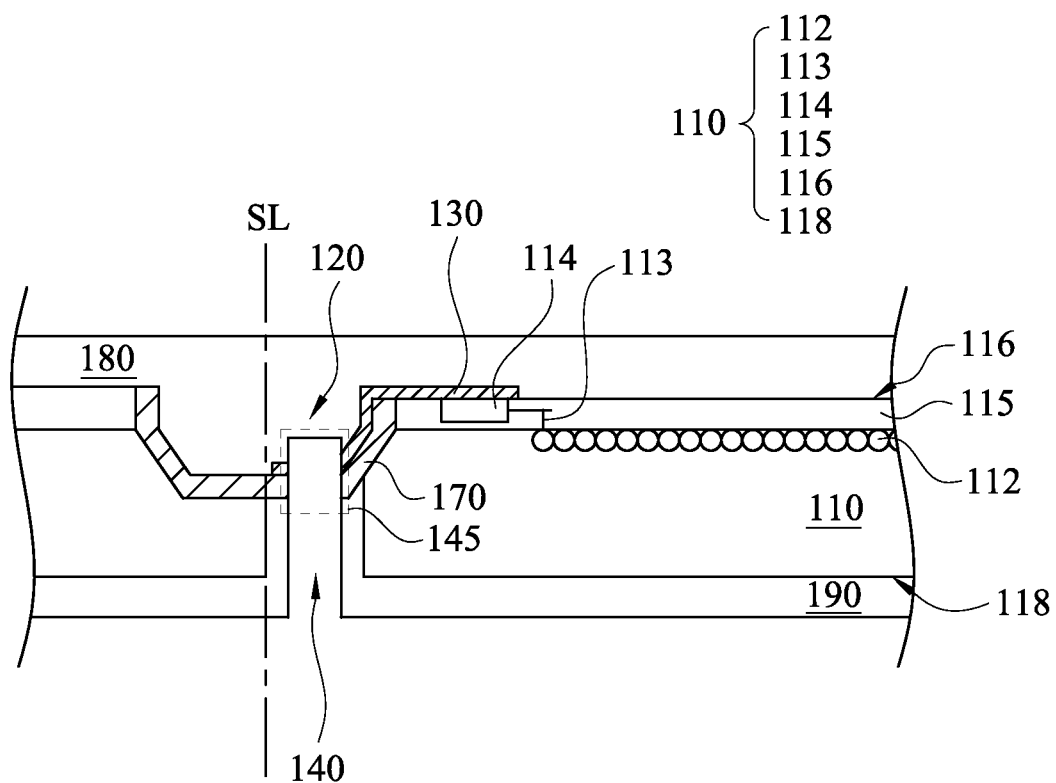
FIG. 13 is a partially cross-sectional views showing a step of manufacturing chip package in accordance with an embodiment of the instant disclosure.

FIG. 13 is a partially cross-sectional views showing a step of manufacturing chip package in accordance with an embodiment of the instant disclosure. Please refer to FIG. 13. Before the second depression 140 is formed, the second passivation layer 190 is formed on the lower surface 118. Subsequently, the second depression 140 is formed by laser drilling. As shown in FIG. 13, laser drilling may drill through and expose the first redistribution layer 130. Therefore, the connection portion 145 is formed between the second depression 140 and the first depression 120. Referring back to FIG. 4, the second redistribution layer 150 is electrically connected to the first redistribution layer 130 through the connection portion 145. The packaging layer 160 and the solder ball 220 are formed by identical means and hereinafter not repeated. As shown in FIGS. 1 to 4, after conducting the above described methods, chip package can be cut along the scribe line SL. The scribe line SL is positioned between each semiconductor chip 110. Cutting means includes, for example, cutting knife along the scribe line SL so as to separate two adjacent chip packages.

In summary, the chip package and method of manufacturing the same provided by the instant disclosure have dual redistribution layer. The conductive pad on the upper surface of the semiconductor chip is therefore electrically connected to the solder ball or solder wire. As a result, the electrical conducting path of the conductive pad in the semiconductor chip is achieved by the connection between the upper and lower redistribution layers. Accordingly, the semiconductor chip can be manufactured with a thicker profile, and it is not necessary to thin the semiconductor chip or use carrier substrate, and eventually it saves production cost. The thicker semiconductor chip has better mechanical strength, the process margin can be improved, and the process yield is increased. Furthermore, the upper surface of the semiconductor chip can be planar surface that provides more implications functional-wise or an easier access for stacking another chip package.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
    a semiconductor chip having at least an electronic component and at least a conductive pad, the conductive pad and the electronic component being electrically connected and disposed on an upper surface of the semiconductor chip;
    a first depression recessing from the upper surface toward a lower surface of the semiconductor chip;
    a first redistribution layer extending from the upper surface toward the lower surface, wherein the first redistribution layer and the conductive pad are electrically connected and a portion of the first redistribution layer is disposed in the first depression;
    a first passivation layer overfilling the first depression and covering the first redistribution layer and the upper surface;
    a second depression recessing from the lower surface toward the upper surface into the first passivation layer;
    a second redistribution layer extending from the lower surface to an overlapping region between the first depression and the second depression and terminating the first redistribution layer; and
    a packaging layer disposed on the lower surface.

2. The chip package of claim 1, further comprising a first insulation layer disposed in the first depression and a portion of the first redistribution layer being disposed on the first insulation layer.

3. The chip package of claim 2, wherein the first insulation layer is formed with an opening, and the second redistribution layer is electrically connected to the first redistribution layer through the opening.

4. The chip package of claim 1, wherein a surface of the first passivation layer is substantially planar.

5. The chip package of claim 1, further comprising a second passivation layer disposed in the second depression and covering the lower surface, and the second passivation layer being sandwiched between the semiconductor chip and the second redistribution layer.

6. The chip package of claim 1, wherein the packaging layer fills the second depression.

7. The chip package of claim 1, further comprising a second passivation layer filling the second depression and covering the lower surface and the second redistribution layer.

8. The chip package of claim 7, wherein the packaging layer is disposed under the second passivation layer.

9. The chip package of claim 1, further comprising a second insulation layer disposed in the second depression, wherein the second insulation layer has an opening, and the second redistribution layer is electrically connected to the first redistribution layer through the opening.

10. The chip package of claim 1, further comprising a soldering ball disposed under the packaging layer, wherein the soldering ball is electrically connected to the second redistribution layer through an opening of the packaging layer.

11. The chip package of claim 1, wherein a distance between the upper and lower surface is approximately 300 to 600 μm.

12. A method of manufacturing a chip package, comprising: providing a semiconductor chip having at least an electronic component and at least a conductive pad, the conductive pad and the electronic component being electrically connected and disposed on an upper surface of the semiconductor chip;
    forming a first depression recessing from the upper surface toward a lower surface of the semiconductor chip;
    forming a first redistribution layer extending from the upper surface toward the lower surface, wherein the first redistribution layer and the conductive pad are electrically connected and a portion of the first redistribution layer is disposed in the first depression;
    forming a first passivation layer overfilling the first depression and covering the first redistribution layer and the upper surface;
    forming a second depression recessing from the lower surface toward the upper surface into the first passivation layer;

forming a second redistribution layer extending from the lower surface to an overlapping region between the first depression and the second depression and terminating the first redistribution layer; and disposing a packaging layer on the lower surface.

13. The method of claim 12, further comprising disposing a first insulation layer in the first depression, wherein a portion of the first redistribution layer is disposed on the first insulation layer.

14. The method of claim 13, wherein the first insulation layer is formed with an opening, and the second redistribution layer is electrically connected to the first redistribution layer through the opening.

15. The method of claim 12, wherein a surface of the first passivation layer is substantially planar.

16. The method of claim 12, further comprising disposing a second passivation layer in the second depression and covering the lower surface, wherein the second passivation layer is sandwiched between the semiconductor chip and the second redistribution layer.

17. The method of claim 12, wherein the packaging layer fills the second depression.

18. The method of claim 12, further comprising forming a second passivation layer filling the second depression and covering the lower surface and the second redistribution layer.

19. The method of claim 18, wherein the packaging layer is disposed under the second passivation layer.

20. The method of claim 12, further comprising disposing a second insulation layer in the second depression, wherein the second insulation layer has an opening, and the second redistribution layer is electrically connected to the first redistribution layer through the opening.

21. The method of claim 12, further comprising disposing a soldering ball under the packaging layer, wherein the soldering ball is electrically connected to the second redistribution layer through an opening of the packaging layer.

22. The method of claim 12, wherein a distance between the upper and lower surface is approximately 300 to 600 μm.

* * * * *